United States Patent [19]

Friauf

[11] 4,068,310

[45] Jan. 10, 1978

[54] DISPLAY ENHANCEMENT TECHNIQUE FOR VIDEO MOVING TRACE DISPLAY

[75] Inventor: Walter S. Friauf, Bethesda, Md.

[73] Assignee: The United States of America as represented by the Department of Health, Education and Welfare, Washington, D.C.

[21] Appl. No.: 707,759

[22] Filed: July 22, 1976

[51] Int. Cl.² .................. G06F 15/20; H01J 29/52
[52] U.S. Cl. .................. 364/521; 315/383; 324/121 R; 340/324 AD; 358/107; 358/166; 364/607; 128/2.06 G
[58] Field of Search .............. 358/93, 101, 107, 160, 358/166, 135; 235/198, 151, 150.5; 315/364, 367, 371, 383, 386, 30; 340/324 A, 324 AD; 324/121 R; 128/2.06 G; 346/45, 74 CR, 74 ME

[56] References Cited

U.S. PATENT DOCUMENTS

| | | | |
|---|---|---|---|
| 3,475,681 | 10/1969 | Nerwin, Jr. et al. | 324/121 R X |
| 3,527,980 | 9/1970 | Robichaud et al. | 340/324 A |
| 3,686,662 | 8/1972 | Blixt et al. | 340/324 AD |
| 3,745,407 | 7/1973 | Day | 340/324 A X |
| 3,752,917 | 8/1973 | Foley et al. | 324/121 R X |

Primary Examiner—Joseph F. Ruggiero
Attorney, Agent, or Firm—Browdy and Neimark

[57] ABSTRACT

A system providing a substantially gapless continuous line display of an analog signal as a function of time on a television monitor. The input is digitized and each level of quantization corresponds to one of the raster display lines to give proper vertical deflection. During each line of raster scan an oscillator and counter sequence the input address to a memory through a desired number of horizontal sampling positions, requiring an address of the order of 8 bits. Each address gives an output of several bits giving in digital form the instantaneous y coordinate of the signal. This is digitally compared with the digitized associated raster line number in a first digital comparator. This is also stored in a register strobed from the above-mentioned counter just before each change of address. The raster line number and the stored previous output are digitally compared in a second digital comparator. If the line number is less than the current trace deflection but greater than the previous deflection, a first AND gate provides an output signal at that instant. Similarly, if the line number is greater than the current trace deflection but less than the previous deflection, a second AND gate provides an output signal. If the current deflection is equal to the line count, this also provides a signal. An OR gate receives these signals, and any one of them will provide a trace-brightening signal at the output of the OR gate. The "equal output" signal is delayed by a time corresponding to ½ the horizontal sampling interval to improve the horizontal resolution.

6 Claims, 4 Drawing Figures

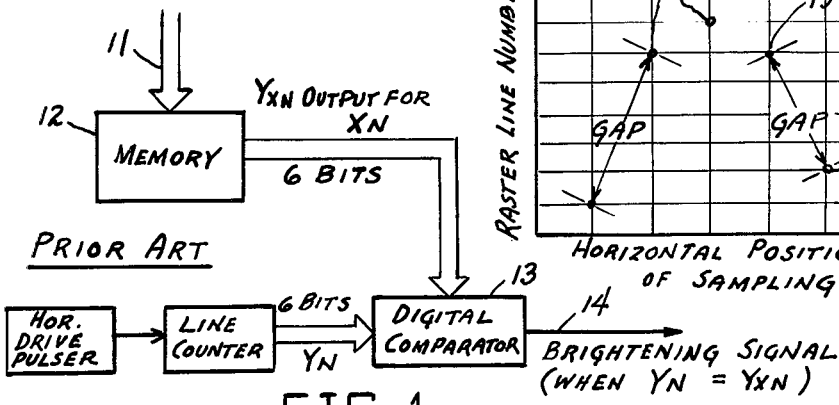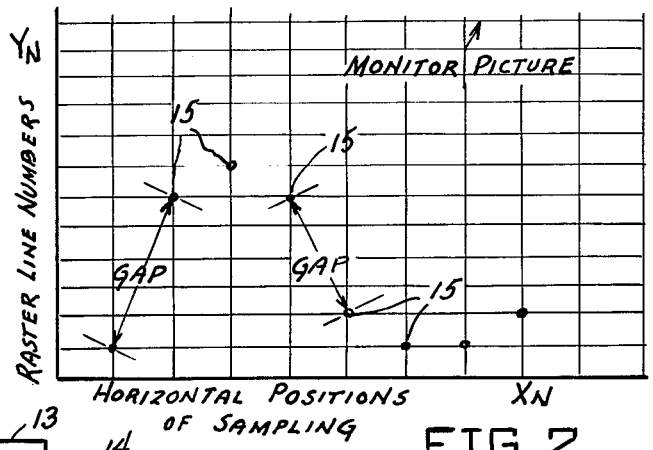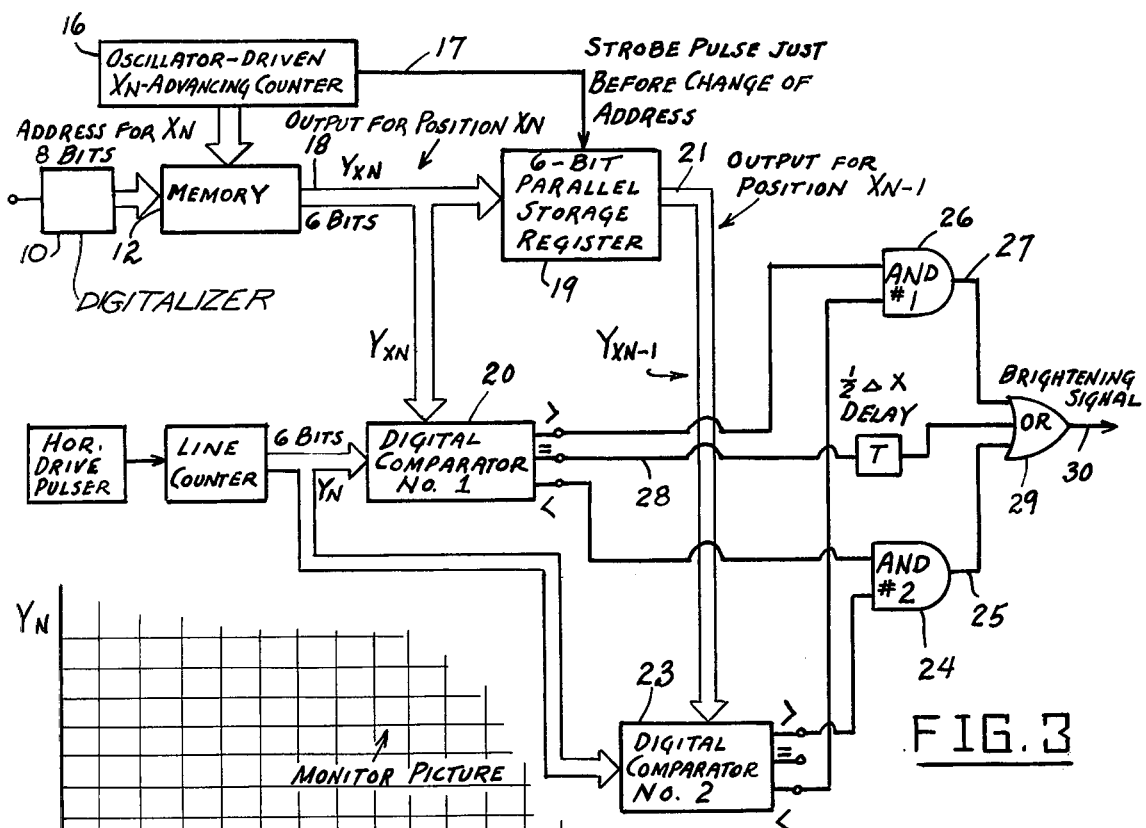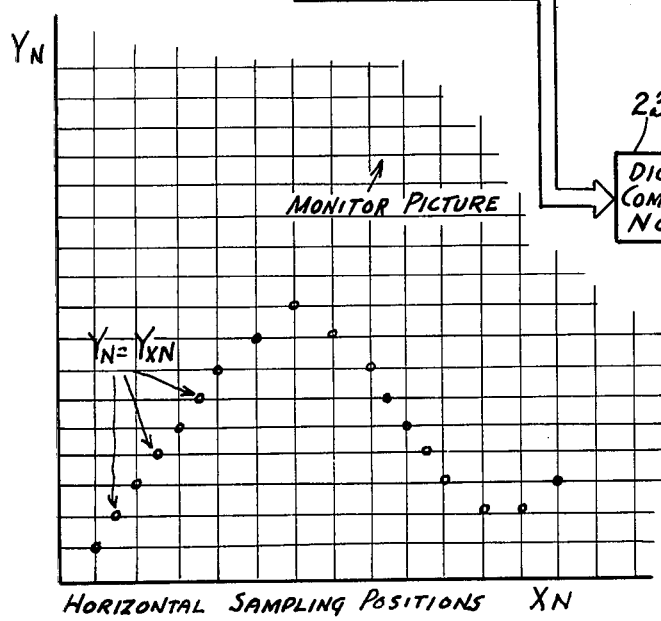

DISPLAY ENHANCEMENT TECHNIQUE FOR VIDEO MOVING TRACE DISPLAY

FIELD OF THE INVENTION

This invention relates to video display devices, and more particularly to devices providing a continuous line display of an analog signal as a function of time on a television monitor.

BACKGROUND OF THE INVENTION

It is possible to provide a continuous line display of an analog signal with a closed circuit television system by employing a television camera directed at a strip chart recorder displaying the analog signal and superimposing the resultant video signal output on the normal video signal. This approach is cumbersome and difficult to adjust properly.

Another approach, illustrated in FIG. 1, employs an electronic system in which the input is digitized and wherein each level of quantization corresponds to one of the lines of the raster display to give the proper vertical deflection. Any desired number of horizontal sampling position inputs may be stored in shift registers or random access memories, with the readout shifted and new data added on each frame to provide the moving trace display. However, if the input is changing rapidly, successive samples may have a vertical separation of more than one quantization level, or more than 1 line in the display. Therefore, the trace appears to have gaps wherever it has a steep slope.

FIG. 1 shows a simplified form of such a prior art system. During each line of the raster scan, an oscillator and counter, not shown, sequence the address (at 11) to a memory 12 through all the horizontal coordinates of the display, perhaps several hundred, requiring an address of several bits, of the order of 8 bits. Each address results in an output $Y_{XN}$ of several bits giving in digital form the y coordinate of the signal at that instant of time. This is digitally compared in a comparator 13 to the y coordinate (shown digitally at $Y_N$) of the line being scanned at the time, and when the two are identical, the comparator 13 provides an output at 14 comprising a brightening signal, which increases the video signal so as to cause a bright spot 15 (see FIG. 2) to be displayed as a point of the trace. FIG. 2 illustrates how gaps appear in the trace where the trace has relatively steep slopes.

SUMMARY OF THE INVENTION

Accordingly, a main object of the invention is to provide an improved system for accomplishing the effective removal of the above-described trace gaps and wherein the trace gaps are substantially filled in.

A further object of the invention is to provide a novel and improved system for providing a continuous line display of an analog signal as a function of time on a television monitor, wherein the trace is substantially free of gaps, which has a high degree of resolution, which is reliable in operation, and which employs relatively inexpensive and readily-available components.

BRIEF DESCRIPTION OF THE DRAWINGS

Further objects and advantages of the invention will become apparent from the following description and claims, and from the accompanying drawings, wherein:

FIG. 1 is a block diagram of a prior art system employed to provide a display of an analog signal as a function of time on a television monitor.

FIG. 2 is an enlarged somewhat diagrammatic view of a portion of a video screen illustrating how the bright spots are displayed as points of a trace in the prior art system of FIG. 1.

FIG. 3 is a block diagram of an improved system for providing a continuous display of an analog signal on a television monitor, in accordance with the present invention.

FIG. 4 is a diagrammatic enlarged view of a portion of a monitor television screen illustrating how the bright spots are displayed as points of a trace, employing the system of FIG. 3.

DESCRIPTION OF A PREFERRED EMBODIMENT

FIG. 3 diagrammatically shows an improved system according to the present invention. As in FIG. 1, an oscillator-driven counter unit 16 may be employed to provide the address to a memory 12, which has its signal input coupled to the output from a signal digitalizer 10, and to advance through the successive horizontal sampling positions. The signal digitalizer 10 effects the digitalization of the input signal so that each level of quantization corresponds to one of the raster lines. The oscillator employed in unit 16 runs at a rate sufficient to address all memory locations while one line of the television screen raster is being scanned. The unit 16 is wired to provide a strobe pulse in an output line 17 just before each change of address to the memory 12. As a result, the digital output $Y_{XN}$ of the memory 12 at 18 is the digital trace deflection at the point of the television scan being displayed.

The memory output $Y_{XN}$ is delivered to a parallel storage register 19 as well as to a digital comparator 20. Register 19 is strobed by the strobe pulse in line 17 just before each change of address to memory 12, so that the digital output of register 19 at 21 is the trace deflection $Y_{XN-1}$ at the preceding point in time, which is the point just to the left on the scan line.

Thus, the additional register 19 stores the previous output $Y_{XN-1}$ from memory 12 so that it is available at 21, while the current output $Y_{XN}$ is available at 18. Both outputs are simultaneously compared with the scan line number $Y_N$ by the respective digital comparators 23 and 20, which provide "greater than" ($>$), "equal to" ($=$), or "less than" ($<$) outputs. If the line number $Y_N$ is less than the current trace deflection $Y_{XN}$ but greater than the previous deflection $Y_{XN-1}$, an AND gate 24, to which the corresponding register outputs are connected, will provide an output at 25 at that instant. Similarly, if the line number $Y_N$ is greater than the current trace deflection $Y_{XN}$ but less than the previous deflection $Y_{XN-1}$, an AND gate 26, to which the corresponding register outputs are connected, will provide an output at 27. If the current deflection $Y_{XN}$ is equal to the line count $Y_N$, the ($=$) output of the comparator 20 will provide an output signal at 28. Lines 27 and 25 are directly connected to inputs of an OR gate 29. Line 28 is connected to an input of OR gate 29 through a signal delay device T.

Any of these signals applied to the OR gate 29 will provide a brightening signal at the output line 30, causing the trace to be brightened, thus providing the desired trace.

The delay device T is constructed to provide a signal delay of ½ of the time between successive horizontal sampling points, so that the fill-in points are midway, horizontally, between the closest points above and below them that were actually sampled. This delay is employed to improve the horizontal resolution, and if the horizontal resolution is otherwise satisfactory, the delay device T may be omitted.

FIG. 4 illustrates how a substantially gapless line display of an analog signal as a function of time is displayed on a monitor screen by means of the system shown in FIG. 3. As above mentioned, the fill-in points fall midway between the closest points above and below them where $Y_N = Y_{XN}$. It will be seen that the display of FIG. 4 does not have the gaps at the relatively steep slope portions thereof, appearing in the display of FIG. 2.

The system described and illustrated herein may be employed for the superpositioning of analog information onto a video display operating with a NTSC input, for example, for the display of cardiographic information during the video display of a catheterization procedure, or for any other application in scientific, medical or industrial activities.

While a specific embodiment of an improved system for providing a continuous line display of an analog signal as a function of time on a television monitor has been disclosed in the foregoing description, it will be understood that various modifications within the spirit of the invention may occur to those skilled in the art. Therefore it is intended that no limitations be placed on the invention except as defined by the scope of the appended claims.

What is claimed is:

1. In combination with a television screen employing raster lines, an apparatus for displaying an input analog signal as a function of time, means to digitize the input signal so that each level of quantization corresponds to one of the raster lines, a memory device, means to sequence the digitized input signal to said memory device through predetermined sampling interval positions for each raster line, first comparator means, counter means to derive digitized raster line numbers, means connecting outputs of said memory device and said counter means to said first comparator means, said first comparator means having respective "greater than", "equal" and "less than" outputs, storage register means, means to insert the output of said memory device into said storage register means just before each change of address of the input signal to said memory device, whereby said storage register means contains the previous digitized input signal while said memory device contains a current digitized input signal, second comparator means having respective "greater than" and "less than" outputs, means connecting the outputs of said storage register means and said raster line counter means to said second comparator means, spot-brightening means, and means to activate said spot-brightening means responsive respectively to concurrent "greater than" and "less than" outputs from the first and second comparator means, to concurrent "less than" and "greater than" outputs from said first and second comparator means, or an "equal" output from said first comparator means.

2. An analog signal display apparatus of claim 1, wherein said means to activate said spot-brightening means include means responsive to concurrent "greater than" and "less than" outputs and comprises two respective AND gates, and said spot-brightening means comprises an OR gate and includes means connecting said concurrent "greater than" and "less than" outputs from said respective AND gates and said "equal" output from said first comparator means to the inputs of said OR gate.

3. An analog signal display apparatus of claim 2, wherein said means to activate said spot-brightening means include a delay device connecting the "equal" output from said first comparator means to the OR gate.

4. An analog signal display apparatus of claim 3, wherein said delay is a delay device which provides a delay approximately equal to ½ the raster line sampling interval.

5. An analog signal display apparatus of claim 1, including delay means coupling the "equal" output from said first comparator means to said spot-brightening means.

6. An analog signal display apparatus of claim 5, wherein said delay means is a delay means which provides a delay approximately equal to ½ the raster line sampling interval.

* * * * *